(12) United States Patent
Huang et al.

(10) Patent No.: US 12,002,721 B2
(45) Date of Patent: Jun. 4, 2024

(54) METHOD OF FABRICATING SEMICONDUCTOR STRUCTURE

(71) Applicant: Taiwan Semiconductor Manufacturing Company, Ltd., Hsinchu (TW)

(72) Inventors: Kuan-Yu Huang, Taipei (TW); Sung-Hui Huang, Yilan County (TW); Shang-Yun Hou, Hsinchu (TW); Chien-Yuan Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 127 days.

(21) Appl. No.: 17/874,326

(22) Filed: Jul. 27, 2022

(65) Prior Publication Data

US 2022/0375806 A1 Nov. 24, 2022

Related U.S. Application Data

(62) Division of application No. 16/920,408, filed on Jul. 2, 2020, now Pat. No. 11,450,580.

(60) Provisional application No. 62/953,469, filed on Dec. 24, 2019.

(51) Int. Cl.
| | | |
|---|---|---|
| *H01L 25/065* | (2023.01) | |
| *H01L 21/52* | (2006.01) | |
| *H01L 23/04* | (2006.01) | |
| *H01L 23/31* | (2006.01) | |
| *H01L 23/538* | (2006.01) | |

(52) U.S. Cl.
CPC .............. *H01L 23/04* (2013.01); *H01L 21/52* (2013.01); *H01L 23/3121* (2013.01); *H01L 23/538* (2013.01); *H01L 25/0655* (2013.01)

(58) Field of Classification Search
CPC ...... H01L 23/538; H01L 21/52; H01L 25/065
See application file for complete search history.

(56) References Cited

U.S. PATENT DOCUMENTS 10,957,656 B2 * 3/2021 Yazzie ................ H01L 23/4006
11,004,771 B2 * 5/2021 Hsieh ...................... H01L 24/92

* cited by examiner

*Primary Examiner* — Dale E Page
*Assistant Examiner* — Wilner Jean Baptiste
(74) *Attorney, Agent, or Firm* — JCIPRNET

(57) ABSTRACT

A method of fabricating a semiconductor structure includes providing a first substrate comprising a first side and a second side opposite to the first side. A package is attached to the first side of the first substrate. A second substrate is attached to the second side of the first substrate. A plurality of electrical connectors is bonded between the second side of the first substrate and the second substrate. A lid is attached to the first substrate and the second substrate. The lid includes a ring part and a plurality of overhang parts. The ring part is over the first side of the first substrate. The plurality of overhang parts extends from corner sidewalls of the ring part toward the second substrate. The plurality of overhang parts are laterally aside the plurality of electrical connectors.

20 Claims, 11 Drawing Sheets

METHOD OF FABRICATING SEMICONDUCTOR STRUCTURE

CROSS-REFERENCE TO RELATED APPLICATION

This application is a divisional application of and claims the priority benefit of U.S. application Ser. No. 16/920,408, filed on Jul. 2, 2020. The U.S. application Ser. No. 16/920,408 claims the priority benefit of U.S. provisional application Ser. No. 62/953,469, filed on Dec. 24, 2019. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure, where a semiconductor chip is attached to a wafer (e.g., an interposer) to form a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 5A illustrate cross-sectional views of intermediate stages of manufacturing a semiconductor structure in accordance with various embodiments.

FIGS. 1B through 5B illustrate top views of intermediate stages of manufacturing the semiconductor structure of FIGS. 1A through 5A.

FIGS. 8B through 10B illustrate top views of the semiconductor structure of FIGS. 8A through 10A.

DETAILED DESCRIPTION

Figure 1A:
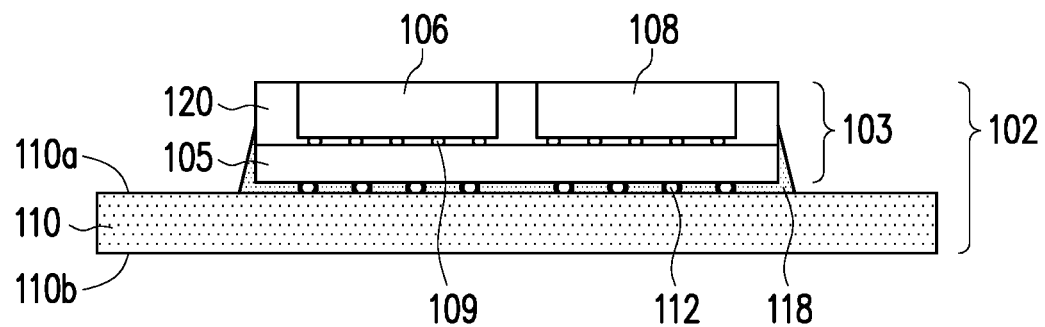

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Various embodiments provide semiconductor structures including a lid. The lid has a plurality of overhang parts. The overhang parts are attached to a board to prevent warpage of the CoWoS structure and cold joints between the CoWoS structure and the board. Additionally, the overhang parts are disposed to surround the corner sidewalls of the CoWoS structure to protect the electrical connectors and reduce cracks in the electrical connectors resulting from external stress.

FIGS. 1A through 5A illustrate cross-sectional views of intermediate stages of manufacturing a semiconductor structure 100 in accordance with various embodiments. FIGS. 1B through 5B illustrate top views of intermediate stages of manufacturing the semiconductor structure 100 of FIG. 1A through 5A. FIG. 6 illustrates a perspective view of the semiconductor structure 100 of FIG. 5A. In various embodiments, the semiconductor structure 100 includes a package 103, a first substrate 110 and a second substrate 104. The package 103 may a three-dimensional integrated circuit device (e.g., Chip-on-Wafer (CoW) package), and the package 103 may be referred to as a CoW package 103. The CoW package 103 is bonded to the first substrate 110. A combination of the CoW package 103 and the first substrate 110 may be referred to as a Chip-on-Wafer-on-Substrate (CoWoS) structure 102. The CoWoS structure 102 may include chip stacking such as logic-on-logic (LoL), memory-on-logic (MoL), or the like.

Figure 1B:
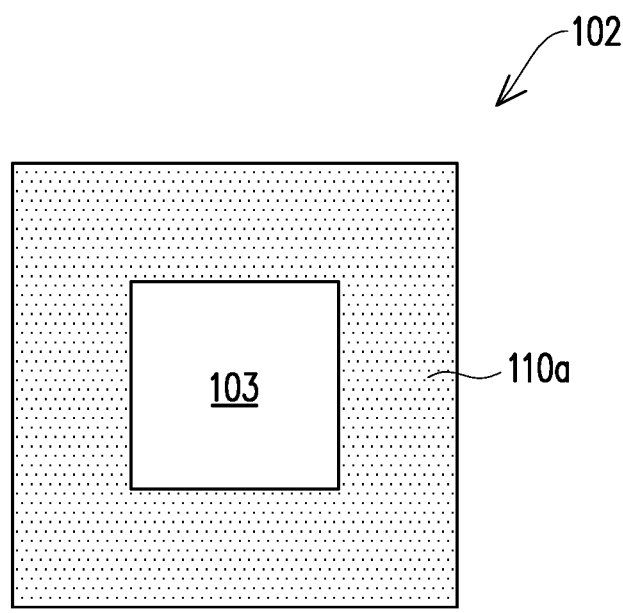

FIGS. 1A and 1B illustrate the CoWoS structure 102. In some embodiments, the CoW package 103 of the CoWoS structure 102 includes a die 106, a die 108 and a package component 105. The die 106 may be the same as or different from the die 108. For example, the first die 106 and the second die 108 have different power consumption. In some embodiments, the die 106 may be a high-power consuming die, and the die 108 may be a low-power consuming die. While FIG. 1A illustrates a CoWoS structure 102 having one die 106 and one die 108, other embodiments may include any number of dies 106 and/or dies 108. The die 106 may be disposed between two dies 108. The die 106 and the die 108 may be die stacks and may be referred to as chips. The die 106 consumes a relatively high amount of power and, therefore, generates a relatively large amount of heat compared to the lower-power consuming dies. For example, the die 106 may consume from about 100 W to about 1,000 W of power and the die 108 may consume from about 10 W to about 100 W of power. A ratio of the power consumed by the die 106 to the power consumed by the die 108 may be from about 10 to about 30, such as about 16. In some embodiments, the die 106 may be a processor, such as a central processing unit (CPU), a graphics processing unit (GPU), or the like. The die 108 may be a memory die such as a high bandwidth memory (HBM), memory cube, memory stack, or the like. In some embodiments, the dies 106 and 108 are respectively a fan-out package and a fan-in package.

The die 106 and the die 108 may be surrounded by an encapsulant 120 which includes a molding compound. The die 106, the die 108, and the encapsulant 120 may be planarized such that top surfaces of the die 106, the die 108, and the encapsulant 120 are level. Because heat may not be generated in the encapsulant 120, heat dissipation requirements may be lower in areas near the encapsulant 120.

The package component 105 of the CoW package 103 may be an interposer substrate, which may be a semiconductor substrate such as a silicon substrate. The package component 105 may also be formed of another semiconductor material such as silicon germanium, silicon carbide, or the like. In accordance with some embodiments, active devices such as transistors (not separately illustrated) are formed at a surface of the package component 105. Passive devices (not separately illustrated) such as resistors and/or capacitors may also be formed in the package component 105. In accordance with alternative embodiments of the present disclosure, the package component 105 may be a semiconductor substrate or a dielectric substrate, and the respective package component 105 may not include active devices therein. In accordance with these embodiments, the package component 105 may, or may not, include passive devices formed therein.

Through vias may be formed to extend from the top surface of the package component 105 into the package component 105. The through vias may be referred to as through-substrate vias or through-silicon vias in embodiments in which the package component 105 is a silicon substrate. In some embodiments, the package component 105 may include an interconnect structure (not separately illustrated) formed over a substrate which is used to electrically connect to the integrated circuit devices, if any, and the through vias of the CoWoS structure 102. The interconnect structure may include a plurality of dielectric layers, metal lines formed in the dielectric layers, and vias formed between, and interconnecting, the overlying and underlying metal lines. In accordance with some embodiments, the dielectric layers may be formed of silicon oxide, silicon nitride, silicon carbide, silicon oxynitride, combinations thereof, and/or multi-layers thereof. Alternatively, the dielectric layers may include one or more low-k dielectric layers having low dielectric constants (k values). The k values of the low-k dielectric materials in the dielectric layers may be lower than about 3.0 or lower than about 2.5, for example.

The package component 105 has a top view size greater than the top view sizes of the dies 106 and 108. The die 106 and the die 108 may be bonded to the package component 105 through flip chip bonding, wherein a plurality of electrical connectors 109 such as metal bumps, solder balls, or the like are used to bond the die 106 and the die 108 to the package component 105.

The CoW package 103 is attached to a first side of the first substrate 110. In some embodiments, the CoW package 103 is bonded to a top surface 110a of the first substrate 110. The CoW package 103 may be electrically and mechanically coupled to the first substrate 110 through a plurality of electrical connectors 112, which may be conductive bumps, micro bumps, metal pillars, or the like.

The first substrate 110 may be a ceramic substrate or an organic substrate. The organic substrate may be laminate or a build-up organic substrate. The first substrate 110 further includes conductive features such as conductive layers and conductive vias. The conductive layers and conductive vias may be formed of any suitable material such as copper foil and copper/copper alloy, respectively. Other conductive materials may also be used. The conductive features may be used for thermal conductive purposes to dissipate heat away from the center of the dies 106 and 108. In some embodiments, conductive features may also be used for electrical connections, for example, as ground, power, and/or signal input and output layers in the first substrate 110. In other embodiments, some or all conductive features may not serve electrical functions and may be referred to as dummy features.

In some embodiments, the first substrate 110 includes a core and build-up layers disposed on a front side and a backside of the core. Through-vias may extend from the front side of the core and electrically connect to the backside of the core. The core may include conductive layers (e.g., copper foil). The core may include two, four, six, eight, or more conductive layers. The number of conductive layers may depend on layout design (e.g., electrical circuit design) of the semiconductor structure although additional conductive layers may increase the overall thermal conductivity of the first substrate 110. The build-up layers include an interconnect structure having patterned conductive layers electrically connected by conductive vias. In various embodiments conductive features (the conductive layers and conductive vias) may serve functional electrical purposes such as power, ground, and/or signal IO layers. In various other embodiments, conductive features may include dummy features for increased thermal conductivity. In some embodiments, the first substrate 110 includes active devices, passive devices, and the like. In some embodiments, the first substrate 110 includes different numbers of core layer and build-up layers depending on layout design.

An underfill material 118 may be formed between the first substrate 110 and the CoW package 103, surrounding the first electrical connectors 112. The underfill material 118 may also extend and surround the CoW package 103.

Figure 2A:
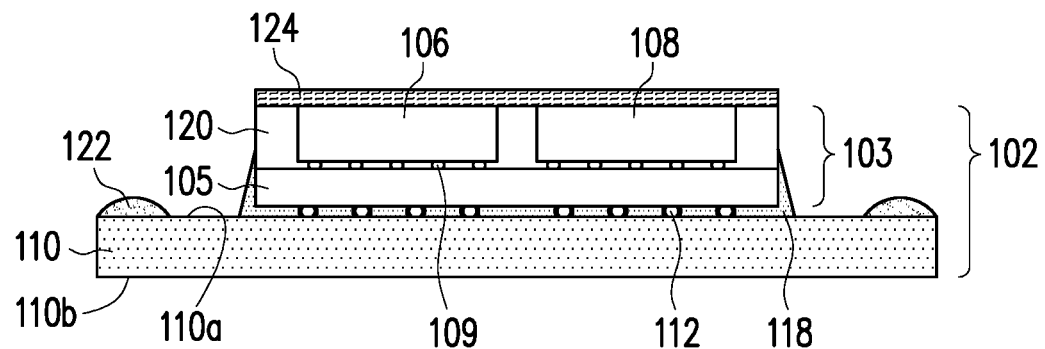
Figure 2B:
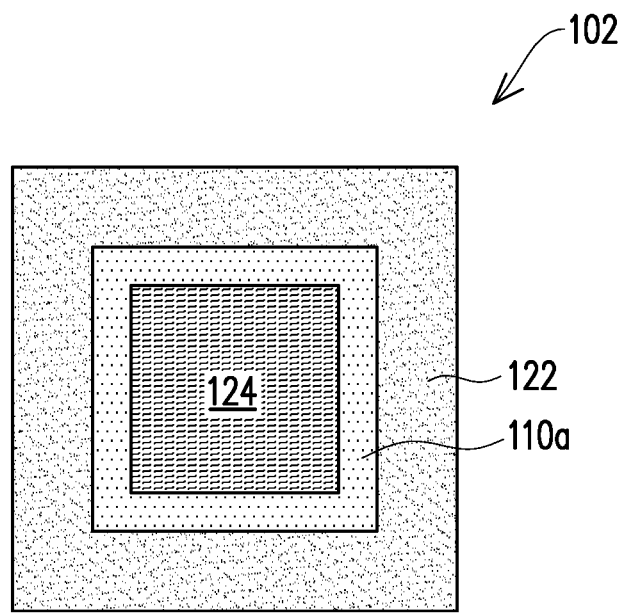

In FIGS. 2A and 2B, in some embodiments, the CoWoS structure 102 includes an adhesive 122 deposited on the top surface 110a of the first substrate 110. In some embodiments, the CoWoS structure 102 further includes a thermal interface material (TIM) 124 deposited over the CoW package 103. The adhesive 122 may be an epoxy, a silicon resin, a glue, or the like. The adhesive 122 may have a better adhering ability than the TIM 124. The adhesive 122 may be positioned so as to allow a heat dissipating feature (e.g., a lid 126, illustrated in FIG. 3A) to be attached around the CoWoS structure 102. Thus, in some embodiments, the adhesive 122 may be disposed around the perimeter of, or even encircle, the CoW package 103.

Figure 3A:
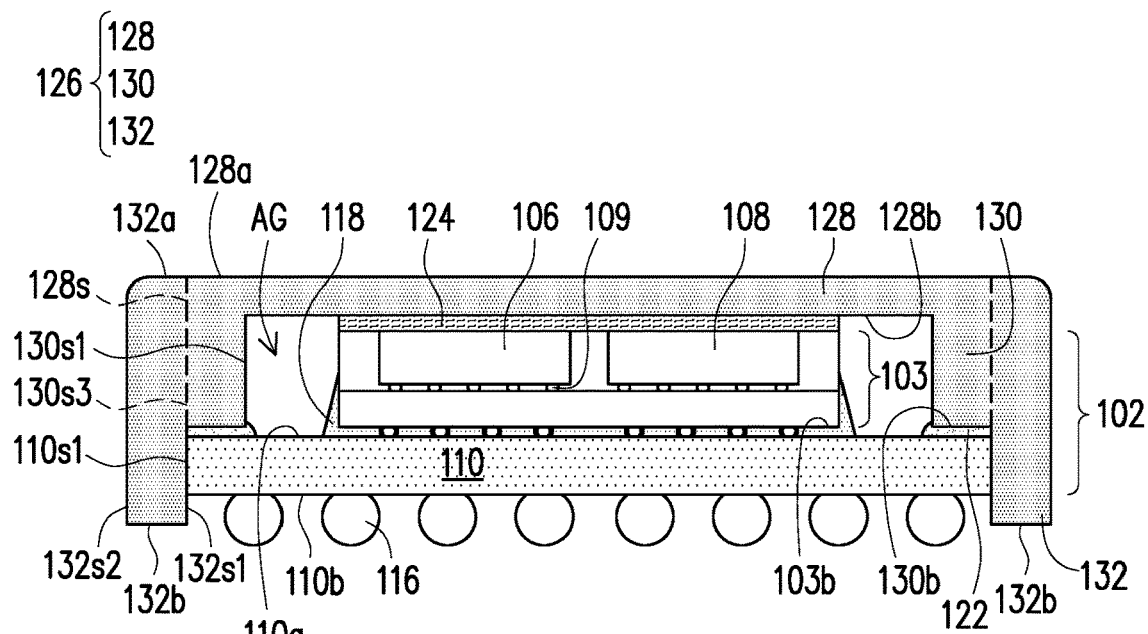

The TIM 124 may be a polymer having a good thermal conductivity to allow a heat dissipating feature (e.g., a lid 126, illustrated in FIG. 3A). In some embodiments, the TIM 124 may include a polymer with thermal conductive fillers. The thermal conductive fillers may increase the effective thermal conductivity of the TIM 124 to be from about 10 W/m·K to about 50 W/m·K or more. Applicable thermal conductive filler materials may include aluminum oxide, boron nitride, aluminum nitride, aluminum, copper, silver, indium, a combination thereof, or the like. In other embodiments, the TIM 124 may comprise other materials such as a metallic-based or solder-based material comprising silver, indium paste, or the like. In still further embodiments, the TIM 124 may include a film-based or sheet-based material, such as a sheet-based material including synthesized carbon nanotubes (CNTs) or a thermally conductive sheet having vertically oriented graphite fillers.

Although the TIM 124 is illustrated as a continuous TIM extending over the encapsulant 120, the die 106 and the die 108 of the CoW package 103, in some embodiments, the TIM 124 may be discontinuous. For example, voids may be disposed in the TIM 124 between adjacent dies (e.g., the die 106 and/or the die 108) to reduce lateral thermal interaction between the dies. In some embodiments, the TIM 124 may be deposited after the adhesive 122; however, the TIM 124 may also be deposited before the adhesive 122.

Figure 3B:
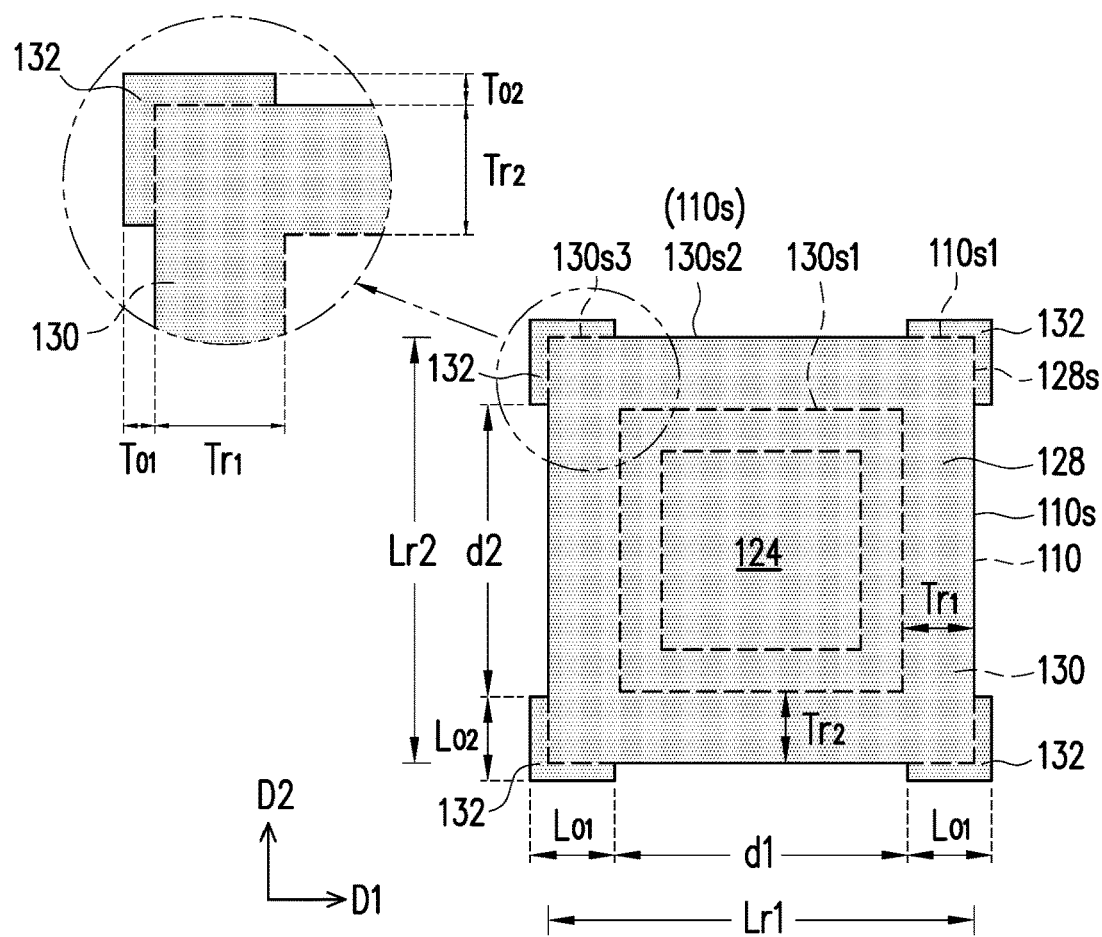

In FIGS. 3A and 3B, a lid 126 is attached to the CoWoS structure 102. The lid 126 may be attached to protect the CoWoS structure 102 to spread heat generated from the CoWoS structure 102 to a larger area, dissipating the heat from the CoWoS structure 102. The lid 126 may be formed from a material having a high thermal conductivity, such as steel, stainless steel, copper, aluminum, combinations thereof, or the like. In some embodiments, the lid 126 may be a metal coated with another metal, such as gold. The lid 126 may be formed of a material having a thermal conductivity from about 100 W/m·K to about 400 W/m·K, such as about 400 W/m·K, for example. If the thermal conductivity of the lid 126 is below 100 W/m·K, it does not provide sufficient heat dissipation. If the thermal conductivity of the lid 126 is greater than 400 W/m·K, the cost of materials for the lid 126 is too high.

The lid 126 covers and surrounds the CoW package 103, and portions of the first substrate 110. In some embodiments, the lid 126 is a single continuous material. In other embodiments, the lid 126 may include multiple pieces that may be the same or different materials.

The lid 126 includes a cap part 128, a ring part 130 and a plurality of overhangs 132. The cap part 128 covers the CoW package 103 and the first substrate 110. The cap part 128 has a top view area greater than the top view area of the CoW package 103. In some embodiments, the cap part 128 of the lid 126 and the first substrate 110 have substantially the same shape and substantially the same top view area. In some embodiments, a bottom surface 128b of the cap part 128 is in physical contact with the TIM 124 over the CoW package 103. Thus, the cap part 128 allows for the dissipation of heat from TIM 124 away from the CoW package 103. In some embodiments, the bottom surface 128b of the cap part 128 is in direct physical contact with the die 106 and the die 108 of the CoW package 103. Thus, the cap part 128 allows for the dissipation of heat away from the CoW package 103.

The ring part 130 of the lid 126 extends from the bottom surface 128b of the cap part 128 toward the first substrate 110. The ring part 130 has a top view size greater than the top view size of the CoW package 103. In the top-view, the ring part 130 may encircle the CoW package 103. The ring part 130, the cap part 128 and the first substrate 110 define a space, and the CoW package 103 is accommodated in the space.

In some embodiments, the top view size of the ring part 130 is the same as the top view size (lengths and widths) of the first substrate 110. The ring part 130 has inner sidewalls 130s1 and outer sidewalls 130s2. In some embodiments, the inner sidewalls 130s1 and outer sidewalls 130s2 of the ring part 130 are straight, but are not limited thereto. The inner sidewalls 130s1 are spaced apart from the underfill material 118. In other words, avoid AG is between the CoW package 103, the underfill material 118 and the ring part 130. The outer sidewalls 130s2 of the ring part 130 may be aligned with sidewalls 110s of the first substrate 110. In some embodiments, the outer sidewalls 130s2 of the ring part 130 and sidewalls 110s of the first substrate 110 are substantially coplanar.

Figure 7A:
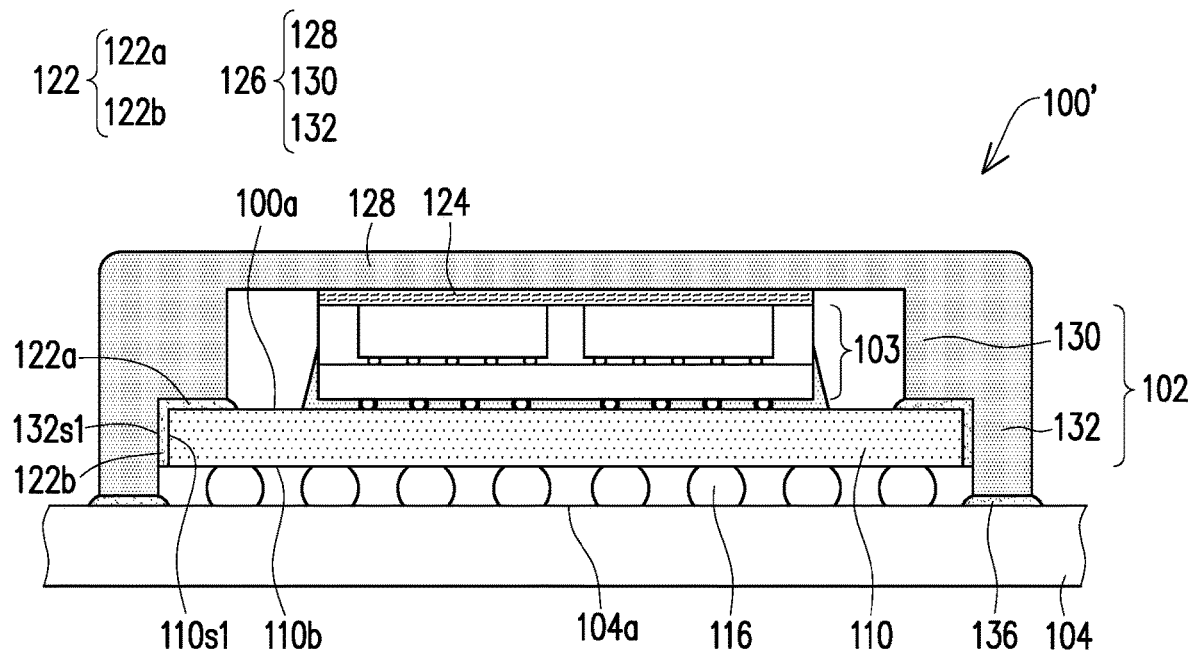
FIGS. 7A, 7B, 8A, 9A and 10A illustrate cross-sectional views of semiconductor structures in accordance with various embodiments.
Figure 7B:
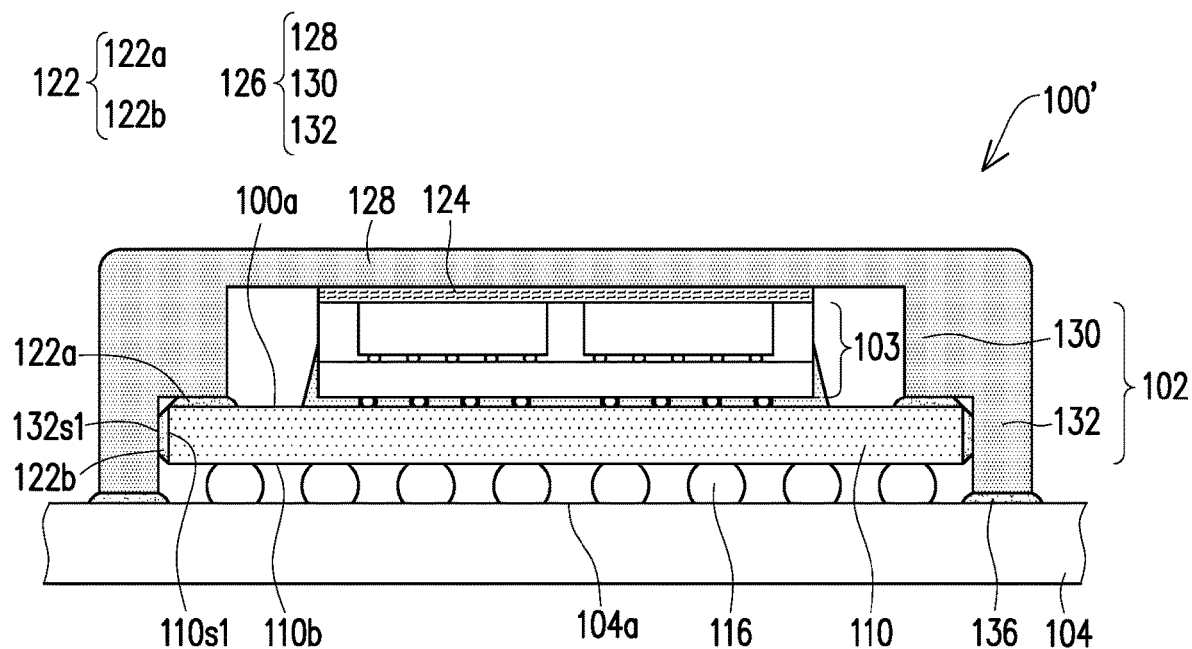

In some embodiments, the top view size of the ring part 130 is greater than the top view size of the first substrate 110 as shown in FIGS. 7A and 7B. The outer sidewalls 130s2 of the ring part 130 may be not aligned with sidewalls 110s of the first substrate 110. The outer sidewalls 130s2 of the ring part 130 may extend laterally beyond the sidewalls 110s of the first substrate 110.

The level of bottom surface 130b of the ring part 130 may be the same as, higher than, or lower than the level of a bottom surface 103b of the CoW package 103. A ratio of an area $A_r$ of the bottom surface 130b of the ring part 130 to an area $A_p$ of the first substrate 110 is in a range from about 10% to about 50%. If the ratio of the area Ar to the area $A_p$ is greater than 50%, the ring part 130 will occupy an excessive area of the first substrate 110 it is difficult for the process to perform BGA rework.

The overhangs 132 of the lid 126 are located at corner sidewalls 128s of the cap part 128, and extend to cover corner sidewalls 130s3 of the overhang parts 130 and the corner sidewalls 110s1 of the first substrate 110. In some embodiments, the lid 126 has four overhangs 132, but the number of overhangs 132 may depend on layout design (e.g., electrical circuit design) of the semiconductor structure. In some embodiments, the overhang parts 132 are substantially conformal to the corner sidewalls 130s3 of the ring part 130 and corner sidewalls 110s1 of the first substrate 110. The overhang parts 132 have, for example, L-like shapes in a top view, but the disclosure is not limited thereto. The overhang parts 132 may all be substantially the same shape or may be different shapes.

The overhang parts 132 have top surfaces 132a. The level of the top surfaces 132a of the overhang parts 132 may be higher than the level of the top surface 110a of the first substrate 110, while the level of the top surfaces 132a of the overhang parts 132 may be lower than, equal to, or higher than the level of a top surface 128a of the cap part 128. In some embodiments, the top surfaces 132a of the overhang parts 132 and the top surface 128a of the cap part 128 are substantially coplanar.

The overhang parts 132 have inner sidewalls 132s1 and outer sidewalls 132s2. The inner sidewalls 132s1 and outer sidewalls 132s2 of the overhang parts 132 may be for example, straight, oblique or curved, but are not limited thereto. In some embodiments, the inner sidewalls 132s1 are in contact with the corner sidewalls 110s1 of the first substrate 110. In some embodiments, the inner sidewalls 132s1 of the overhang parts 132 are separated from the corner sidewalls 110s1 of the first substrate 110 by gaps (as shown in FIGS. 7A and 7B).

The overhang parts 132 have lengths $L_{o1}$ along a first direction D1, and lengths $L_{o2}$ along a second direction D2. The lengths $L_{o1}$ of the overhang parts 132 may be the same or different. The lengths $L_{o2}$ of the overhang parts 132 may be the same or different. The lengths $L_{o1}$ and the lengths $L_{o2}$ may be the same or different. The lengths $L_{o1}$ are less than a length $L_{r1}$ of the ring part 130 along the first direction D1, and the lengths $L_{o2}$ are less than a length $L_{r2}$ of the ring part 130 along the second direction D2. In some embodiments, a ratio of the lengths $L_{o1}$ to the length $L_{r1}$ is in a range from about 60% to about 5%; and a ratio of the lengths $L_{o2}$ to the length $L_{r2}$ is in a range from about 100% to about 5%. If the ratio of the length $L_{o1}$ to the length $L_{r1}$, and/or ratio of the length $L_{o2}$ to the length $L_{r2}$ is greater than 60%, it is difficult for the process to perform BGA rework. If the ratio of the length $L_{o1}$ to the length $L_{r1}$, and/or the ratio of the length $L_{o2}$ to the length $L_{r2}$ is lower than 5%, the overhang parts 132 cannot provide sufficient mechanical strength. In some embodiments, the length $L_{r1}$ of the ring part 130 and the length $L_{r2}$ of the ring part 130 are different, while the lengths $L_{o1}$ and the lengths $L_{o2}$ of the overhang parts 132 are the same.

The overhang parts 132 have thicknesses $T_{o1}$ along the first direction D1, and thicknesses $L_{o2}$ along the second direction D2. The thicknesses $T_{o1}$ of the overhang parts 132 may be the same or different. The thicknesses $T_{o2}$ of the overhang parts 132 may be the same or different. The thickness $T_{o1}$ and the thickness $T_{o2}$ may be the same or different. The thickness $T_{o1}$ is less than a thickness $Tr1$ of the ring part 130 along the first direction D1, and the thickness $T_{o2}$ is less than a thickness $T_{r2}$ of the ring part 130 along the second direction D2. A ratio of the thicknesses $T_{o1}$ to the thickness $T_{r1}$ is in a range, for example, from about 100% to about 10%; and a ratio of the thicknesses $T_{o2}$ to the thickness $T_{r2}$ is in a range for example, from about 100% to about 10%. In some embodiments, the thicknesses $T_{o1}$ and $T_{o2}$ are in a range from 200 μm to 5000 μm, respectively. If the thickness $T_{o1}$ or $T_{o2}$ of the overhang part 132 is less than 200 μm, an area of adhesive 136 (shown in FIG. 5A) is insufficient, resulting in poor adhesive strength. If the thickness $T_{o1}$ or $T_{o2}$ of the overhang part 132 is greater than 5000 μm, the overhang part 132 will occupy an excessive area of the second substrate 104, and increase weight.

Adjacent overhangs 132 are separated by a distance d1 along the first direction D1. A distance d2 separates adjacent overhangs 132 along the second direction D2. The distances d1 and d2 are generally greater than zero. In some embodiments, a ratio of the distance d1 to the length $Lr1$ of the ring 130 is in a range from greater than 0% to about 95%, and a ratio of the distance d2 to the length $L_{r2}$ of the ring 130 is in a range from greater than 0% to about 95%. If the ratio of the distance d2 to the length $L_{r2}$ is greater than 95%, the area of the adhesive 136 (shown in FIG. 5A) is too small, resulting in poor adhesive strength.

The level of bottom surfaces 132b of the overhangs 132 are lower than the level of a bottom surface 110b of the first substrate 110. The bottom surfaces 132b of the overhangs 132 may have the same area or different areas $A_o$. The area $A_o$ of the bottom surface 132b of each overhang part 132 is less than the area $A_r$ of the bottom surface 130b of the ring part 130. In some embodiments, a ratio of the area $A_o$ to the area $A_r$ is in a range from about 0.1% to about 20%. If the ratio of the area $A_o$ to the area $A_r$ is below 0.1%, adhesion strength may be insufficient. If the ratio of the area $A_o$ to the area $A_r$ is greater than 20%, excessive weight and area of the lid 126 may increase cost and produce excessive strain on the underlying substrate.

The bottom surface 130b of the ring part 130 is adhered to the first substrate 110 through the adhesive 122. The adhesive 122 has a greater adhering ability, but a lower thermal conductivity than the TIM 124. As a result, in some embodiments, the adhesive 122 is disposed around the periphery of the CoW package 103 and between the lid 126 and the first substrate 110 to adhere the bottom surface 130b of the ring part 130 of the lid 126 to the top surface 110a of the first substrate 110.

In some embodiments, the adhesive 122 is disposed below the bottom surface 130b of the ring part 130. In alternative embodiments, the adhesive 122 further extends to a lower portion of the inner sidewall 130s1 of the ring part 130, while the adhesive 122 is spaced apart from the underfill material 118. An area of the adhesive 122 may be equal to, less than or greater than an area of the bottom surface 130b of the ring part 130. The adhesive 122 has, for example, a ring shape in a top view, but is not limited thereto.

In alternative embodiments, the adhesive 122 of the semiconductor structure 100' includes a first portion 122a and second portions 122b (as shown in FIGS. 7A and 7B). The first portion 122a is disposed around the periphery of the CoW package 103 and between the lid 126 and the first substrate 110 to adhere the ring part 130 of the lid 126 to the top surface 110a of the first substrate 110. The second portions 122b are disposed in the gaps between the corner sidewall 110s1 of the first substrate 110 and the inner sidewalls 132s1 of the overhang parts 132, so that the overhang parts 132 are adhered to the corner sidewall 110s1 of the first substrate 110 through the second portion 122b. In some embodiments, the second portions 122b are connected to the first portion 122a (as shown in FIG. 7A). In alternative embodiments, the second portions 122b are spaced apart from the first portion 122a (as shown in FIG. 7B).

In FIGS. 3A and 3B, a plurality of electrical connectors 116 are bonded to the bottom surface 110b of the first substrate 110. The plurality of electrical connectors 116 may be conductive bumps, micro bumps, metal pillars, or the like. The electrical connectors 116 below the corners of the first substrate 110 are laterally adjacent to and spaced apart from the overhang parts 132.

Figure 4A:
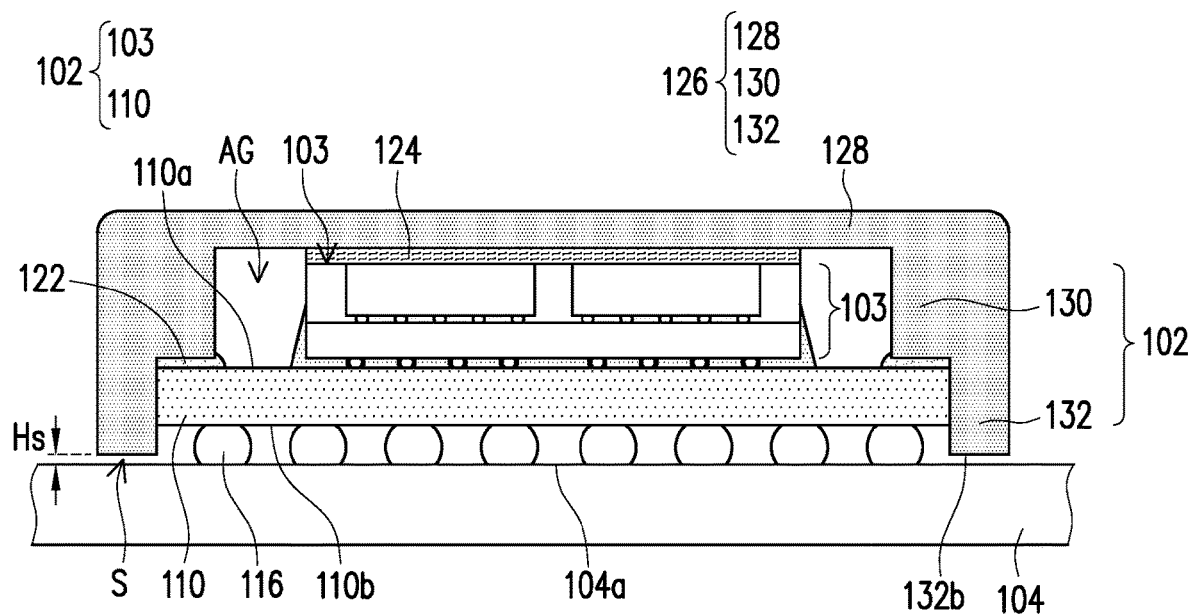
Figure 4B:
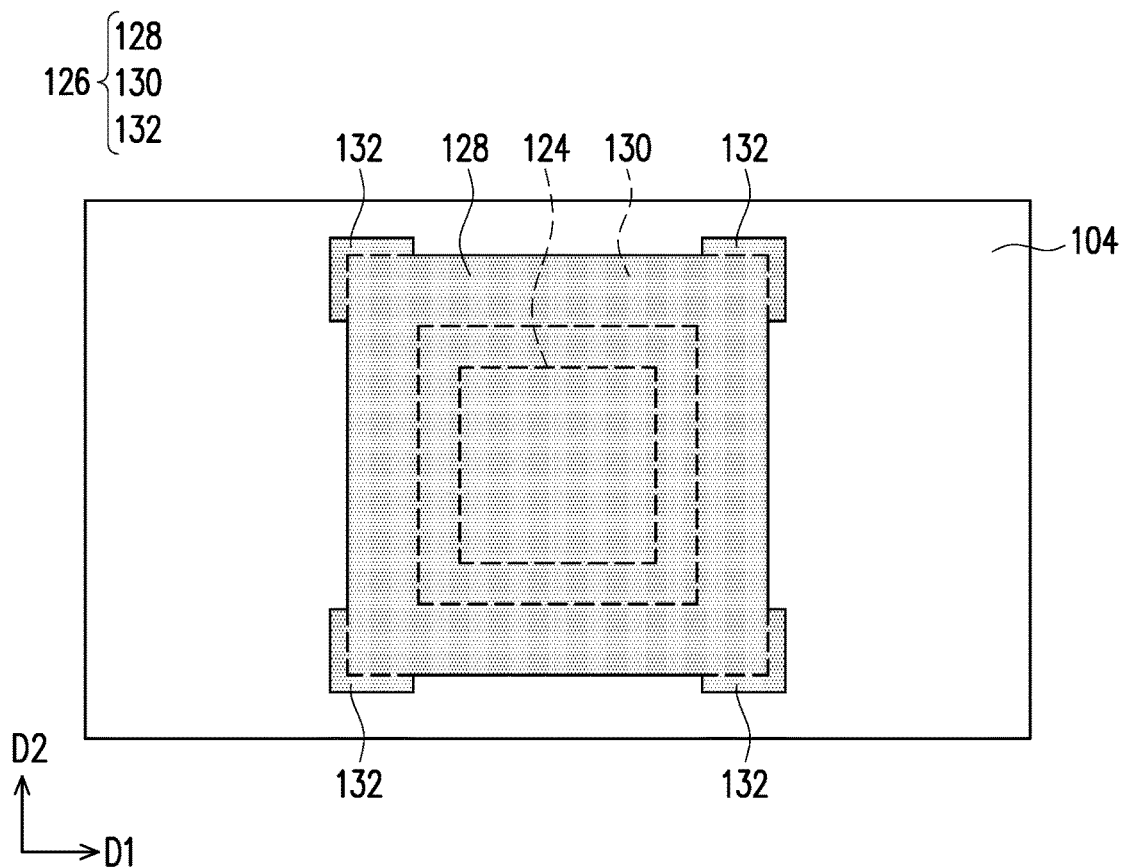

In FIGS. 4A and 4B, the second substrate 104 is attached to a second side opposite to the first side of the first substrate 110. The first substrate 110 of the CoWoS structure 102 is bonded to the top surface 104a of the second substrate 104 through a reflow process. The first substrate 110 may be electrically and mechanically coupled to the second substrate 104 through the electrical connectors 116. The second substrate 104 may be a package substrate, which may be a printed circuit board (PCB) or the like. The second substrate 104 may include one or more dielectric layers and electrically conductive features, such as conductive lines and vias. In some embodiments, the second substrate 104 may include through-vias, active devices, passive devices, and the like. The second substrate 104 may further include conductive pads formed at the upper and lower surfaces of the second substrate 104.

Figure 5A:
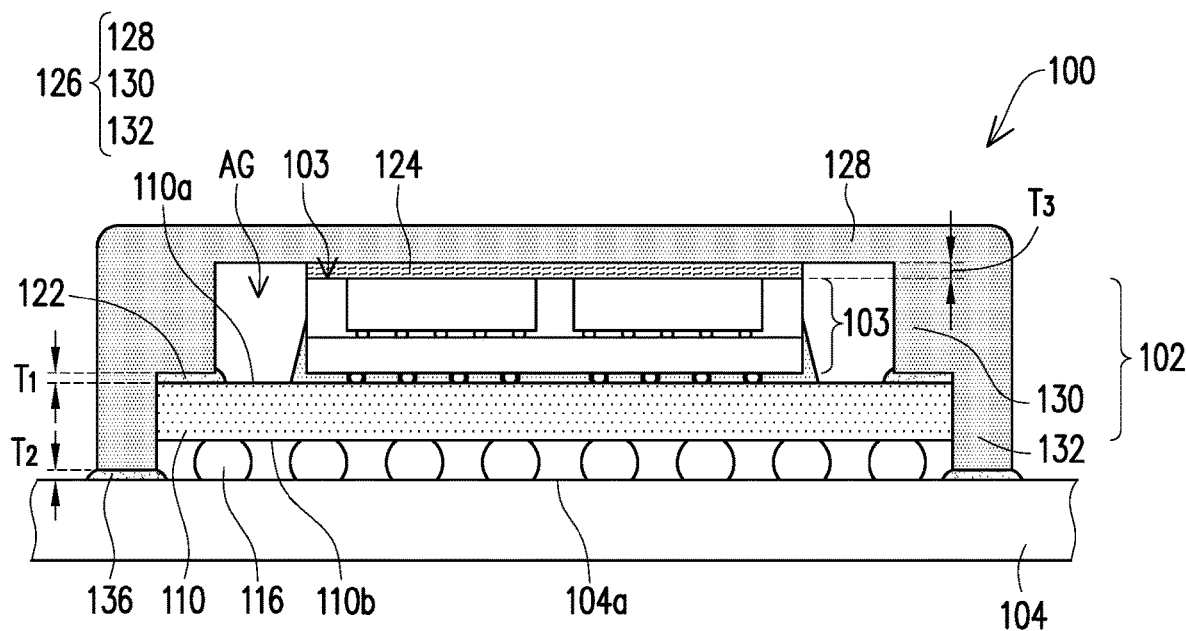
Figure 5B:
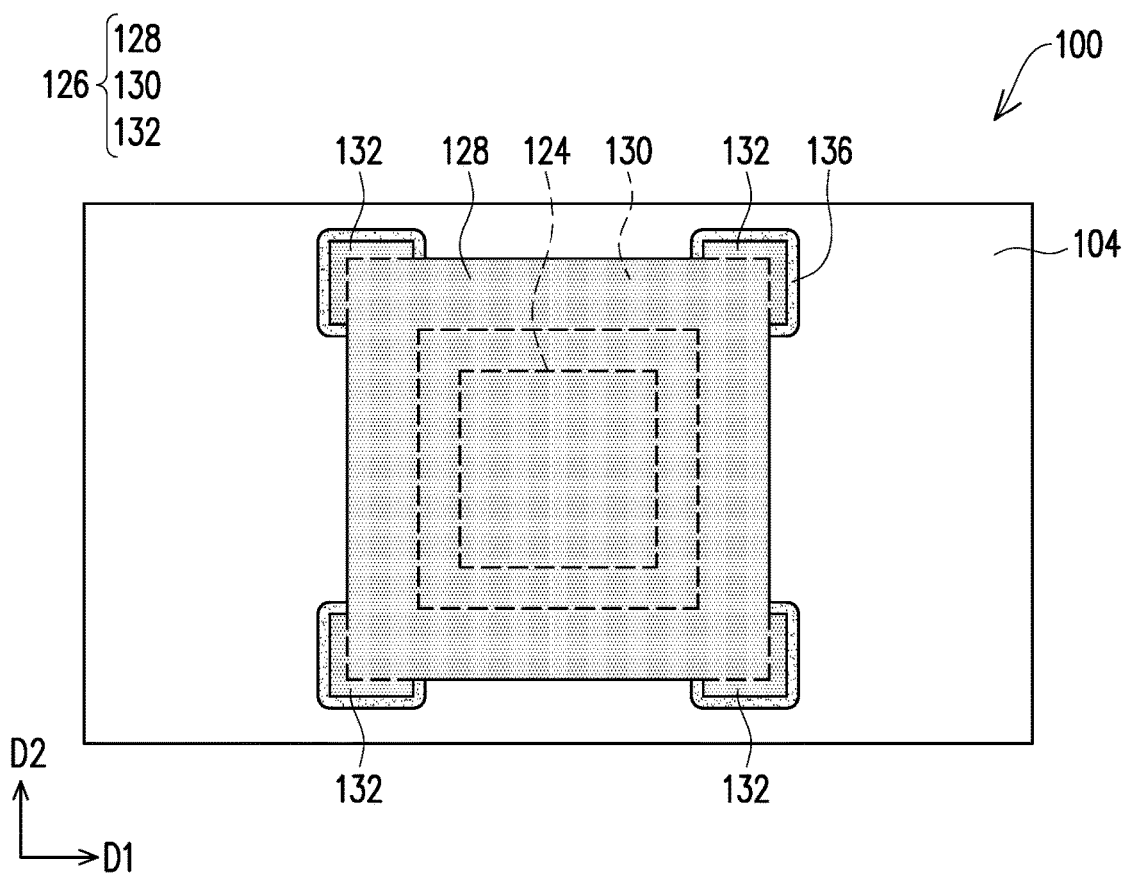
Figure 6:
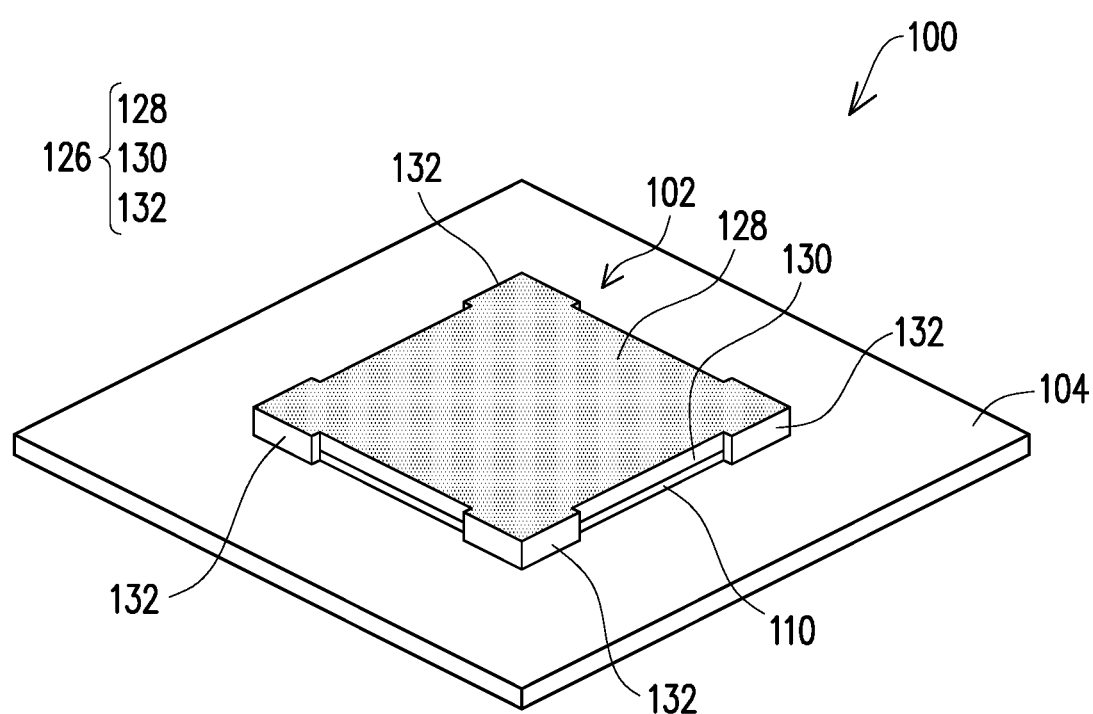
FIG. 6 illustrates a perspective view of the semiconductor structure of the FIG. 5A.

In FIGS. 4A, 5A and 5B, adhesives 136 are dispensed into a space S between the top surface 104a of a second substrate 104 and the bottom surface 132b of the overhang parts 132. A height $H_s$ of the space S ranges from about 10 µm to about 300 µm. If the height of the space S is less than 10 µm, the adhesive 136 is difficult to flow into the space S. If the height $H_s$ of the space S is greater than 300 µm, the capillary effect is too weak for the adhesive 136 to flow. In some embodiments, the adhesive 136 are spaced apart from the electrical connectors 116. The adhesive 136 may be an epoxy, a silicon resin, a glue, or the like. The adhesive 136 may have a better adhering ability than the TIM 124. The adhesive 136 and the adhesive 122 may have the same material or different materials. The adhesive 136 may have a Young's modulus from about 10 GPa to about 1 MPa. The adhesive 136 may have a thickness from about 10 µm to about 300 µm.

The bottom surfaces 132b of the overhang part 132 are adhered to the top surface 104a of the second substrate 104 through the adhesives 136. A top view area $A_{a3}$ of each adhesive 136 may be equal to, the same as, or greater than the area $A_{o1}$ of the corresponding overhang part 132. The top view area $A_{a3}$ of each adhesive 136 may be less than a top view area $A_a$ of the adhesives 122, for example. The area $A_{a3}$ of each adhesive 136 and the area $A_a$ of the adhesives 122 are related to the area $A_o$ of the bottom surfaces 132b of the overhangs 132 and the area $A_r$ of the bottom surface 130b of the ring part 130, respectively. In some embodiments, a ratio of the top view area $A_{a3}$ to the top view area $A_a$ is in a range, for example, from about 0.1% to about 20%. If the ratio of the area $A_{a3}$ to the area $A_a$ is below 0.1%, adhesion strength may be insufficient. If the ratio of the area $A_{a3}$ to the area Aa is greater than 20%, excessive weight and area of the lid 126 may increase cost and produce excessive strain on the underlying substrate.

Once the lid 126 and the second substrate 104 are adhered, the adhesives 122 and 136, and the TIM 124 may be cured by applying heat to the adhesives 122 and 136, and the TIM 124. In some embodiments, the adhesives 122 and 136, and the TIM 124 may be cured by placing the CoWoS structure 102 in a curing oven. After the curing process, the adhesive 122 may have a thickness $T_1$ from 200 µm to about 20 µm, and each adhesive 136 may have a thickness T2 less than about 300 µm, and the TIM 124 may have a thickness $T_3$ less than about 200 µm.

In FIGS. 5A, 5B and 6, the overhang parts 132 of the lid 126 which are attached to the second substrate 104 may be used to confine stand-off of the electrical connectors 116 and may help to prevent warpage of the CoWoS structure 102 and cold joints between the CoWoS structure 102 and the second substrate 104. Additionally, the overhang parts 132 of the lid 126, which are disposed to surround the corner sidewalls of the CoWoS structure 102, may protect the electrical connectors 116 and reduce cracks in the electrical connectors 116 resulting from external stress. The reduction in the warpage of the CoWoS structure 102 and the cracks of the electrical connectors 116 contributes to a more reliable semiconductor structure.

Figure 8A:
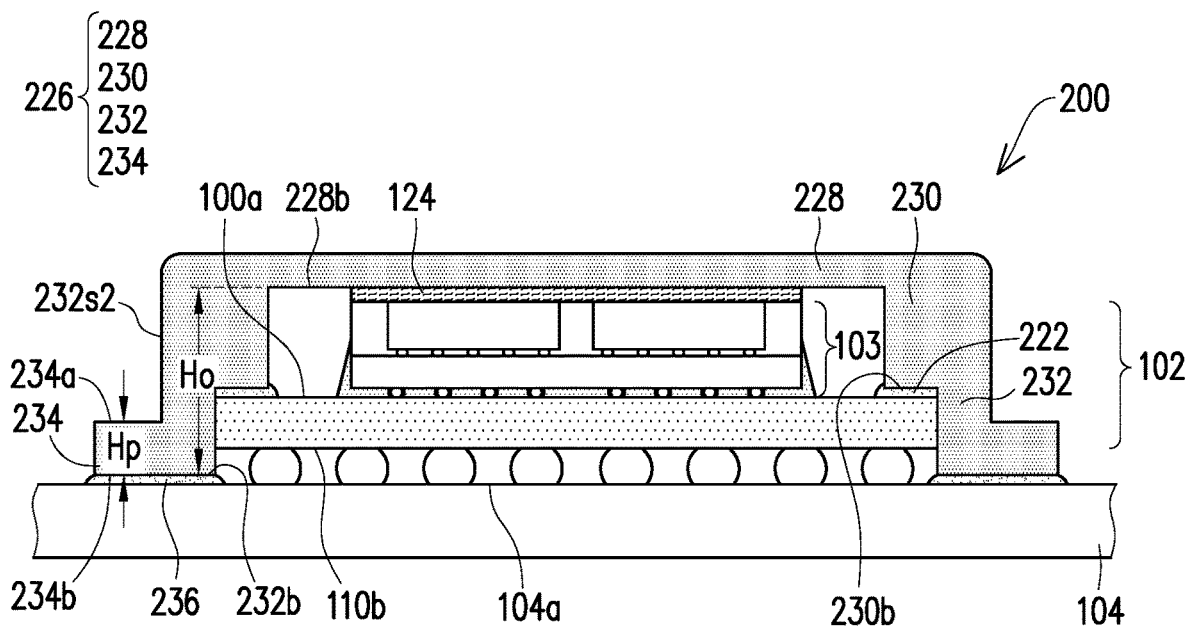
Figure 8B:
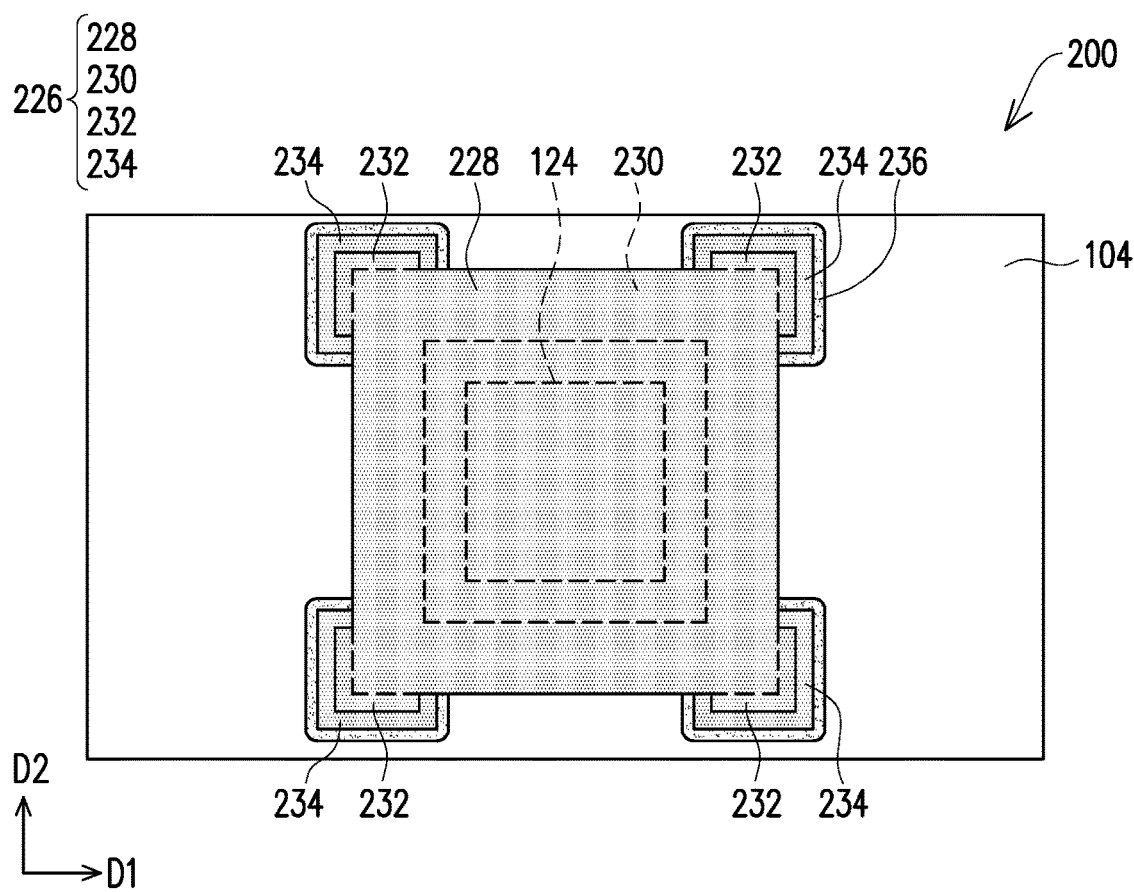

FIG. 8A illustrates cross-sectional view of a semiconductor structure 200 in accordance with various embodiments. FIG. 8B illustrates top views of the semiconductor structure 200 of FIG. 8A.

In FIGS. 8A and 8B, the semiconductor structure 200 is similar to the semiconductor 100 shown in FIGS. 5A and 5B, and like reference numerals refer to like components. The lid 226 of the semiconductor structure 200 includes a cap part 228, a ring part 230, a plurality of overhang parts 232 and a plurality of protrusion parts 234. The configurations and materials of the cap part 228, the ring part 230, and the plurality of overhang parts 232 are similar to the configurations and materials of the cap part 128, the ring part 130, and the plurality of overhang parts 132, and are not repeated again.

The protrusion parts 234 extend from outer sidewalls 232s2 of the overhang parts 232 toward edges of the second substrate 104. A height $H_p$ of the protrusion parts 234 is less than a height Ho of the overhang part 232. The height $H_p$ of the protrusion parts 234 is defined as a distance from a top surface 234a to a bottom surface 234b of the protrusion parts 234. The height $H_o$ of the overhang part 232 is defined as a distance from a bottom surface 228b of the cap part 228 to a bottom surface 232b of the overhang part 232. A ratio of the height $H_p$ to the height $H_o$ is in a range, for example, from about 10% to about 100%. If the ratio of the height $H_p$ to the height $H_o$ is lower 10%, the protrusion parts 234 do not provide sufficient support.

In some embodiments, the protrusion parts 234 are conformal to the overhang part 232. The protrusion parts 234 may have L-like shapes in a top view, for example. A combination of the protrusion parts 234 and the overhang part 232 may have an L-like shape in a top view and in a cross-sectional view, but the disclosure is not limited thereto.

In some embodiments, a ratio of a combination area $A_{po}$ of the bottom surface 234b of the protrusion parts 234 and the bottom surface 232b of the overhang part 232 to an area $A_{r2}$ of the ring part 230 is in a range from about 1% to about 60%. In other some embodiments, the ratio of the combination area $A_{po}$ of the bottom surface 234b of the protrusion parts 234 and the bottom surface 232b of the overhang part 232 to the area $A_{r2}$ of the ring part 230 is in a range from about 1% to about 20%. If the ratio of the area $A_{po}$ to the area $A_{r2}$ is below 1%, adhesion strength may be insufficient. If the ratio of the area $A_{po}$ to the area $A_{r2}$ is greater than 20%, excessive weight and area of the lid 126 may increase cost and produce excessive strain on the underlying substrate.

Adhesives 236 are disposed below the bottom surfaces 232b of the overhang parts 232 and the bottom surfaces 234b of the protrusion parts 234 to adhere the overhang parts 232 and the protrusion parts 234 to the top surface 104a of the second substrate 104. Accordingly, the protrusion parts 234 may increase the adhesion of the lid 126 to the CoWoS structure 102 as the protrusion parts 234 provides additional bottom surfaces 234b.

A top view area $A_{a3}$ of each adhesive 236 may be equal to, the same as, or greater than the area the combination area $A_{po}$ of the bottom surface 234b of the protrusion parts 234 and the bottom surface 232b of the overhang part 232. The top view area $A_{a3}$ of each adhesive 236 may be less than the top view area $A_a$ of the adhesives 222 below the bottom surfaces 230b of the ring part 230, for example. In some embodiments, a ratio of the top view area $A_{a3}$ to the top view area $A_a$ is in a range from about 1% to about 30%. In other some embodiments, the ratio of the top view area $A_{a3}$ to the top view area $A_a$ is in a range from about 1% to about 10%. If the ratio of e top view area $A_{a3}$ to the top view area $A_a$ is below 1%, adhesion strength may be insufficient. If the ratio of the top view area $A_{a3}$ to the top view area $A_a$ is greater than 10%, excessive weight and area of the lid 226 may increase cost and produce excessive strain on the underlying substrate.

Figure 9A:
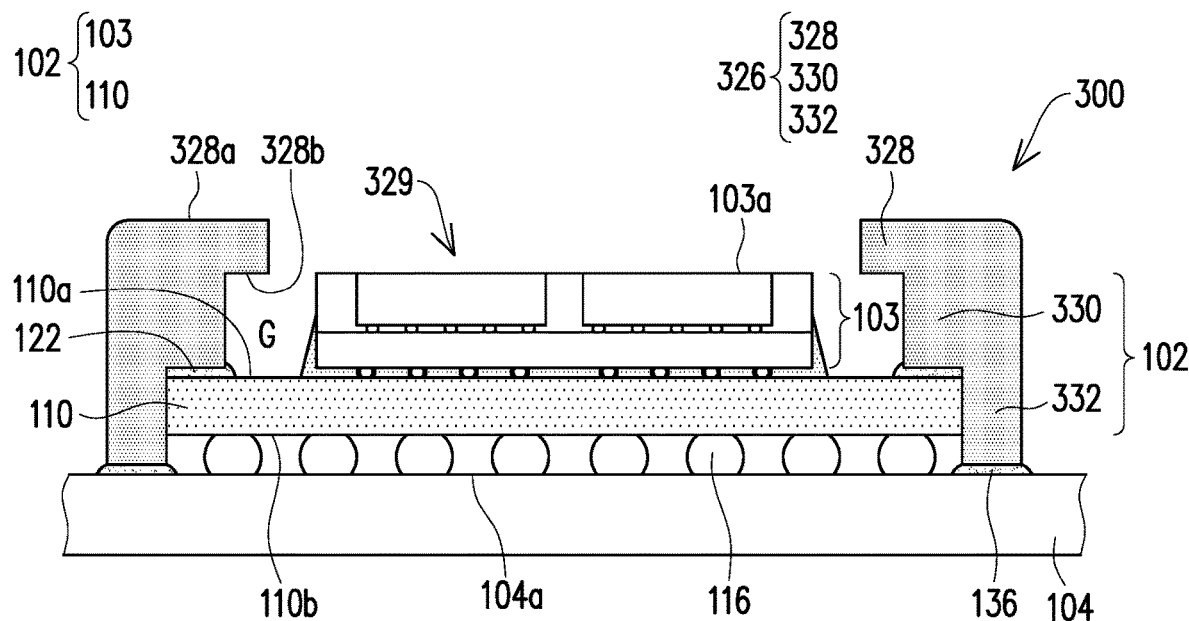
Figure 9B:
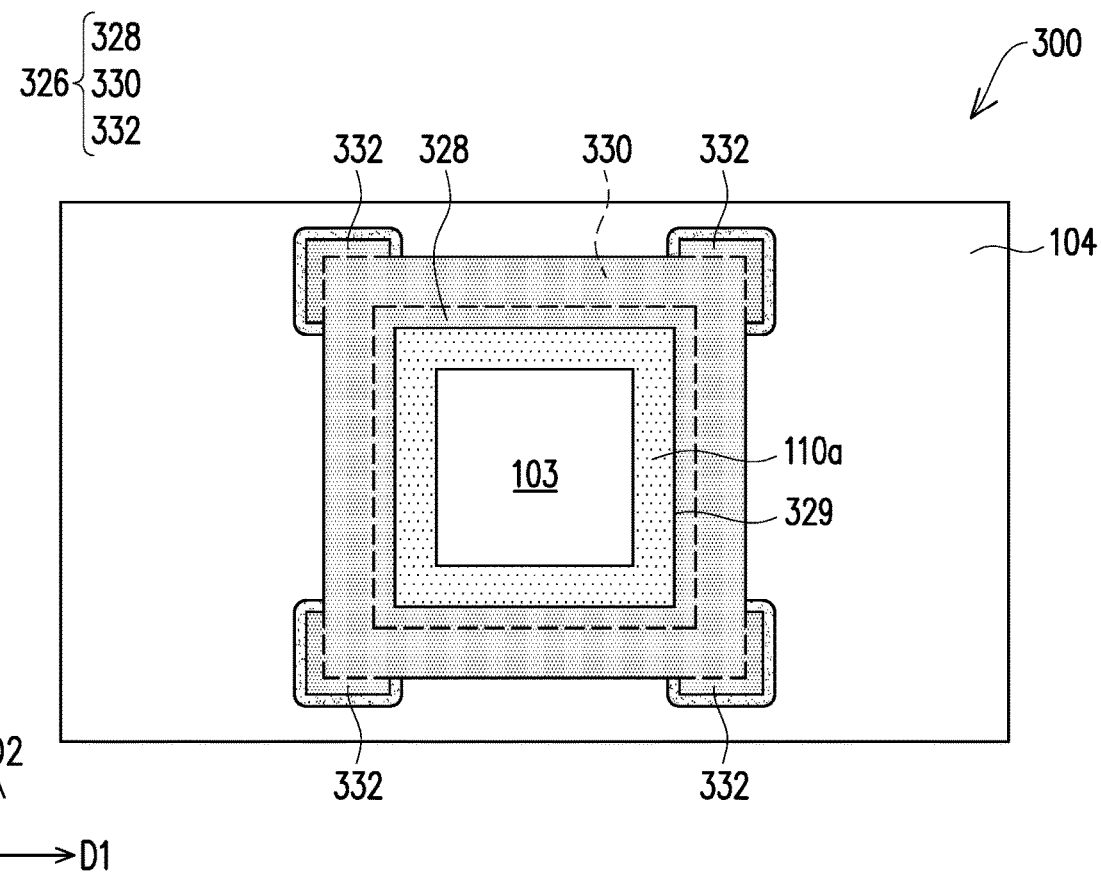

FIG. 9A illustrates cross-sectional view of a semiconductor structure 300 in accordance with various embodiments. FIG. 9B illustrates top views of the semiconductor structure 300 of FIG. 9A.

In FIGS. 9A and 9B, the semiconductor structure 300 is similar to the semiconductor 100 shown in FIGS. 5A and 5B, and like reference numerals refer to like components. The lid 326 of the semiconductor structure 300 includes a cap part 328, a ring part 330, and a plurality of overhang parts 332. The configurations and materials of the ring part 330, and the plurality of overhang parts 332 are similar to the configurations and materials of the ring part 130, and the plurality of overhang parts 132, and are not repeated again. The configuration of the cap part 328 is similar to the configuration of the cap part 128 shown in FIGS. 5A and 5B, but the cap part 328 has an opening 329 therein. The opening 329 has a top-view size that may be less than, equal to, or greater than a top-view size of the CoW package 103. The level of a top surface 328a of the cap part 328 may be lower than, equal to, or higher than the level of a top surface 103a of the CoW package 103. The level of a bottom surface 328b of the cap part 328 may be lower than, equal to, or higher than the level of the top surface 103a of the CoW package 103. In some embodiments, the opening 329 exposes the top surface 103a of the CoW package 103 and communicates with the gap G between the ring part 330 and the CoW package 103 so as to improve heat dissipation from the CoWoS structure 102.

Figure 10A:
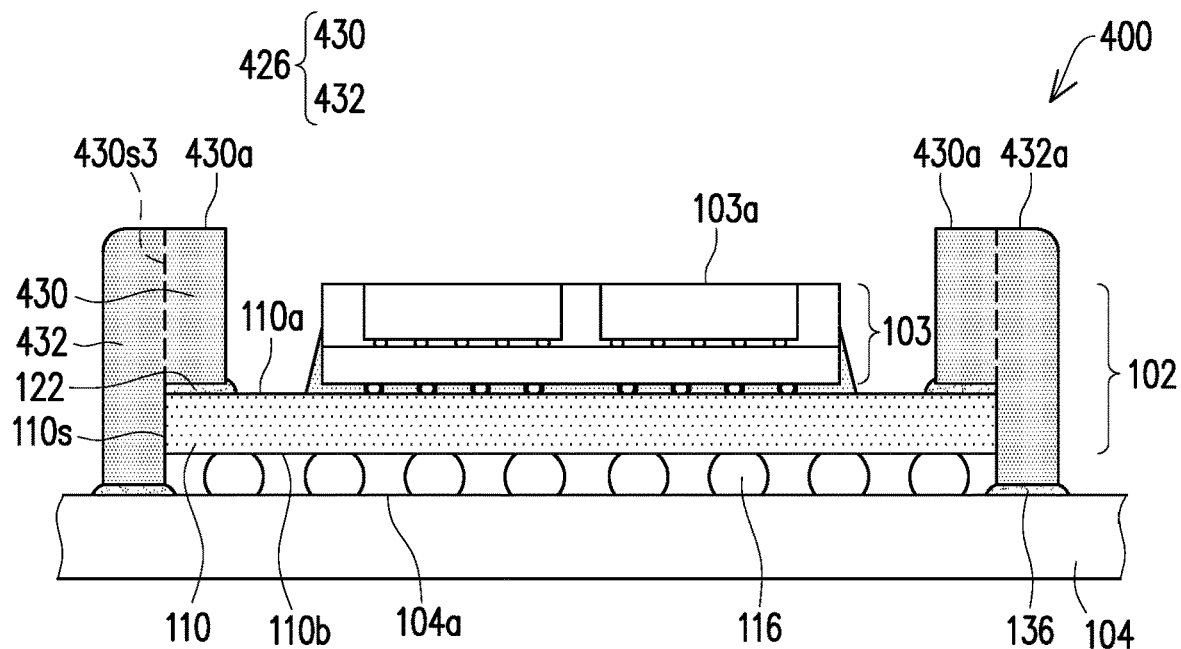
Figure 10B:
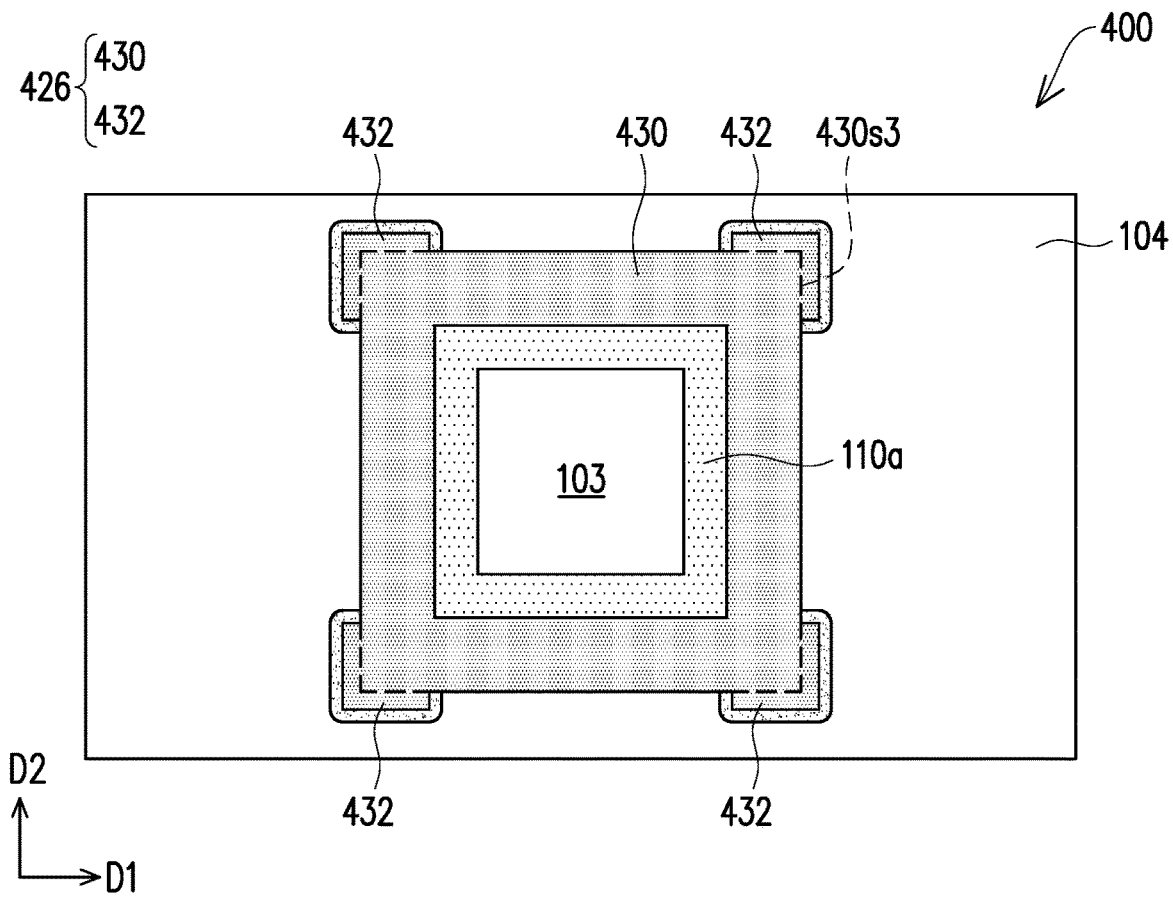

FIG. 10A illustrates cross-sectional view of a semiconductor structure 400 in accordance with various embodiments. FIG. 10B illustrates top views of the semiconductor structure 400 of FIG. 10A.

In FIGS. 10A and 10B, a semiconductor structure 400 is similar to the semiconductor 100 shown in FIGS. 5A and 5B, and like reference numerals refer to like components. The lid 426 of the semiconductor structure 400 includes a ring part 430, and a plurality of overhang parts 432, but does not include a cap part on the ring part 430. The materials and configurations of the ring part 430, and the plurality of overhang parts 432 are similar to the materials and configurations of the ring part 130, and the plurality of overhang parts 132, and are not repeated again. The difference in configuration between lid 426 and 126 is described in detail below.

The overhang parts 432 are located at corner sidewalls 430s3 of the overhang parts 430 and corner sidewalls 110s1 of the first substrate 110. The overhang parts 432 have top surfaces 432a. The level of the top surfaces 432a of the overhang parts 432 may be higher than the level of the top surface 110a of the first substrate 110. The level of the top surfaces 432a of the overhang parts 432 may be lower than, equal to, or higher than the level of the surface 430a of the ring part 430. In some embodiments, the top surfaces 432a of the overhang parts 432 and the top surface 430a of the ring part 430 may be substantially coplanar.

The ring part 430 of the lid 426 is disposed over the first substrate 110 and may encircle the CoW package 103. The level of the top surface 430a of the ring part 430 may be equal to or higher than the level of a top surface 103a of the CoW package 103. The ring part 430 exposes the top surface 103a of the CoW package 103 and a portion of the top surface 110a of the first substrate 110 so as to improve heat dissipation from the CoWoS structure 102.

Figure 11:
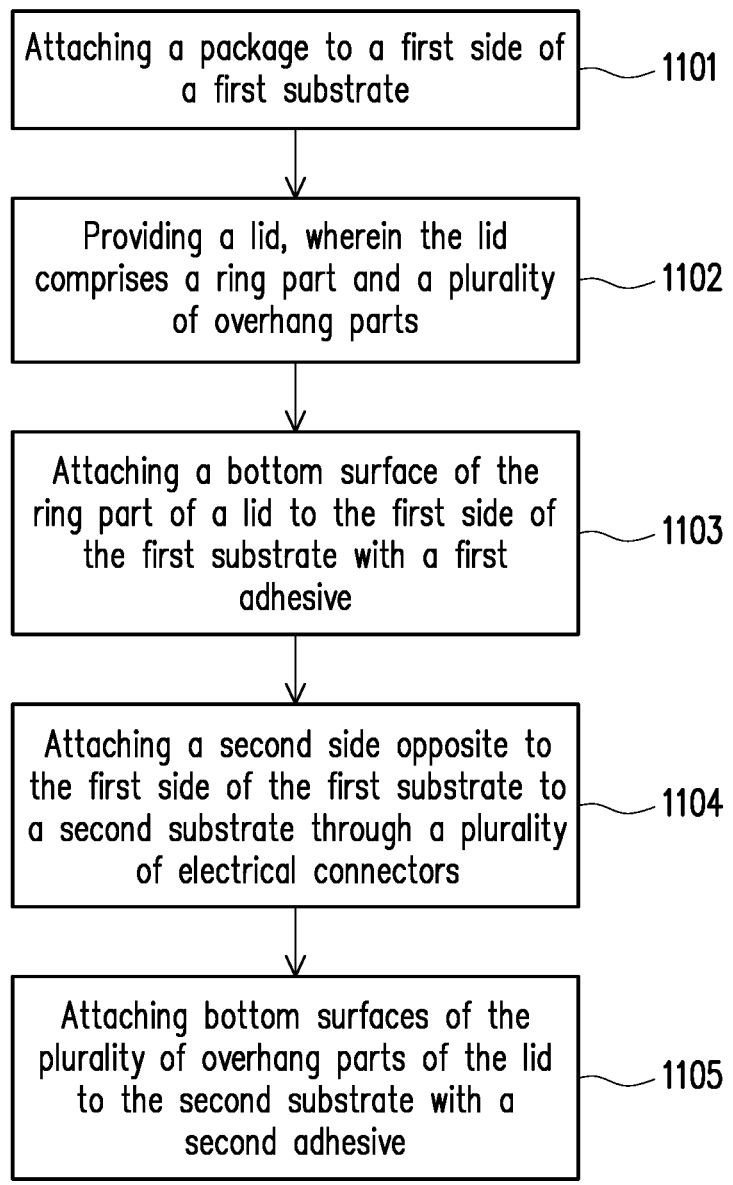
FIG. 11 is a flow diagram illustrating a method of fabricating semiconductor structures in accordance with some embodiments.

FIG. 11 is a flow diagram illustrating a method of fabricating semiconductor structures (such as, for example, the semiconductor structure 100, 100', 300, or 400 illustrated in FIG. 5A) in accordance with some embodiments. The method starts with process 1101, where a package (such as, for example, the package 103 illustrated in FIG. 1A) is attached to a first side of a first substrate (such as, for example, the first substrate 110 illustrated in FIG. 1A) as described above with reference to FIG. 1A. In process 1102, a lid (such as, for example, the lid 126, 226, 326, or 426 illustrated in FIG. 3A, 8A, 9A or 10A) is provided as described above with reference to FIG. 1A. The lid comprises a ring part (such as, for example, the ring part 130, 230, or 330 illustrated in FIG. 3A, 8A or 9A) and a plurality of overhang parts (such as, for example, the overhang parts 132, 332 or 432 illustrated in FIG. 3A, 9A or 10A). In process 1103, a bottom surface of the ring part is attached to the first side of the first substrate with a first adhesive (such as, for example, the adhesive 122, 122a, 222 illustrated in FIG. 3A, 7A or 7B) as described above with reference to FIGS. 3A, 7A and 7B. In process 1104, a second substrate (such as, for example, the second substrate 104 illustrated in FIGS. 3A and 4A) is attached to a second side opposite to the first side of the first substrate through a plurality of electrical connectors (such as, for example, the electrical connectors 116 illustrated in FIGS. 3A and 4A) as described above with reference to FIGS. 3A and 4A. In process 1105, bottom surfaces of the plurality of overhang parts of the lid are attached to the second substrate with a second adhesive (such as, for example, the adhesive 136 illustrated in FIG. 5A) as described above with reference to FIG. 5A.

The embodiments of the disclosure provide semiconductor structures including a lid. The lid has a plurality of overhang parts to confine stand-off of the electrical connectors between a CoWoS structure and a board, and prevent warpage of the CoWoS structure and cold joints between the CoWoS structure and the board. Additionally, the overhang parts surrounding the corner sidewalls of the CoWoS structure may reduce cracks in the electrical connectors resulting from external stress. The reduction in the warpage of the CoWoS structure and the crack of the electrical connectors contributes to a more reliable semiconductor structure.

In accordance with an embodiment, a semiconductor structure includes a first substrate comprising a first side and a second side opposite to the first side; a package attached to the first side of the first substrate; a second substrate attached to the second side of the first substrate; a lid connected to the first substrate and the second substrate, the lid comprising: a ring part over the first side of the first substrate, wherein the ring part and the first substrate define a space and the package is accommodated in the space; and a plurality of overhang parts extended from corner sidewalls of the ring part toward the second substrate to cover corner sidewalls of the first substrate.

In accordance with another embodiment, a semiconductor structure includes a first substrate comprising a first side and second side opposite to the first side; a package attached to the first side of the first substrate; a second substrate attached to the second side of the first substrate; a lid connected to the first substrate and the second substrate, the lid comprising: a cap part; a ring part extending from a bottom surface of the cap part toward the first substrate, wherein the ring part, the cap part and the first substrate define a space and the package is accommodated in the space; and a plurality of overhang parts extended from the corner sidewalls of the cap part toward the second substrate to cover corner sidewalls of the first substrate.

In accordance with yet another embodiment, a method of fabricating a semiconductor structure includes attaching a package to a first side of a first substrate; providing a lid, wherein the lid comprises a ring part and a plurality of overhang parts; attaching a bottom surface of the ring part of the lid to the first side of the first substrate by a first adhesive; attaching a second side opposite to the first side of the first substrate to a second substrate through a plurality of electrical connectors; and attaching bottom surface of the plurality of overhang parts of the lid to the second substrate by a second adhesive, the plurality of overhang parts extending from corner sidewalls of the ring part toward the second substrate to cover corner sidewalls of the first substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
   providing a first substrate comprising a first side and a second side opposite to the first side;
   attaching a package to the first side of the first substrate;
   attaching a second substrate to the second side of the first substrate;
   bonding a plurality of electrical connectors between the second side of the first substrate and the second substrate; and
   attaching a lid to the first substrate and the second substrate, wherein the lid comprises:
      a ring part over the first side of the first substrate; and
      a plurality of overhang parts extended from corner sidewalls of the ring part toward the second substrate, wherein the plurality of overhang parts are laterally aside the plurality of electrical connectors.

2. The method of claim 1, wherein the attaching the lid to the first substrate and the second substrate comprises:
   attaching a bottom surface of the ring part of the lid to the first side of the first substrate, wherein the ring part and the first substrate define a space and the package is accommodated in the space.

3. The method of claim 2, wherein the attaching a bottom surface of the ring part of the lid to the first side of the first substrate vias a first adhesive.

4. The method of claim 3, wherein the attaching the lid to the first substrate and the second substrate further comprises:
   attaching inner sidewalls of the plurality of overhang parts of the lid to sidewalls of the first substrate through the first adhesive.

5. The method of claim 3, wherein the attaching the lid to the first substrate and the second substrate further comprises:
   attaching inner sidewalls of the plurality of overhang parts of the lid to sidewalls of the first substrate through a second adhesive.

6. The method of claim 2, wherein the attaching the lid to the first substrate and the second substrate further comprises:
   contacting inner sidewalls of the plurality of overhang parts of the lid to sidewalls of the first substrate.

7. The method of claim 2, wherein the attaching the lid to the first substrate and the second substrate further comprises:
   attaching bottom surfaces of the plurality of overhang parts of the lid to the second substrate.

8. The method of claim 7, wherein the attaching bottom surfaces of the plurality of overhang parts of the lid to the second substrate vias a plurality of third adhesives.

9. The method of claim 8, wherein the plurality of third adhesives are spaced apart from the plurality of electrical connectors.

10. The method of claim 8, wherein the attaching the lid to the first substrate and the second substrate further comprises attaching bottom surfaces of a plurality of protrusion parts of the lid to the second substrate vias the plurality of third adhesives, wherein the plurality of protrusion parts extends from outer sidewalls of the plurality of overhang parts toward edges of the second substrate.

11. The method of claim 10, wherein one of the plurality of protrusion parts has a bottom surface, and an area of the bottom surface is less than an area of a bottom surface of the ring part.

12. The method of claim 1, wherein one of the plurality of overhang parts has a bottom surface, and an area of the bottom surface is less than an area of a bottom surface of the ring part.

13. The method of claim 1, wherein the attaching the lid to the first substrate and the second substrate further comprises attaching bottom surfaces of a cap part of the lid to the package via a thermal interface material, wherein the ring part extends from a bottom surface of the cap part toward the first substrate, and the ring part, the cap part and the first substrate define a space, and the package is accommodated in the space.

14. A method of fabricating a semiconductor structure, comprising:
   providing a plurality of substrates stacked in a direction;
   attaching a package to one of the plurality of substrates;
   bonding the plurality of substrates through a plurality of electrical connectors; and
   attaching a lid to at least two top surfaces of the plurality of substrates through a plurality of first adhesives, wherein the lid is positioned laterally beside the plurality of electrical connectors.

15. The method of claim 14, further comprising attaching the lid to corner sidewalls of the one of the plurality of substrates.

16. The method of claim 15, wherein the attaching the lid to the corner sidewalls of the one of the plurality of substrates vias a second adhesive.

17. The method of claim 14, further comprising:
   attaching the lid to a top surface of the package through a thermal interface material.

18. A method of fabricating a semiconductor structure, comprising:
   attaching a package to a first side of a first substrate;
   providing a lid, wherein the lid comprises a ring part and a plurality of overhang parts;
   attaching a bottom surface of the ring part of the lid to the first side of the first substrate by a first adhesive;
   attaching a second side opposite to the first side of the first substrate to a second substrate through a plurality of electrical connectors; and
   attaching bottom surfaces of the plurality of overhang parts of the lid to the second substrate by a second adhesive, the plurality of overhang parts extending from corner sidewalls of the ring part toward the second substrate to cover corner sidewalls of the first substrate.

19. The method of claim 18, further comprising bonding the plurality of electrical connectors on the second side of the first substrate before the attaching the second side opposite to the first side of the first substrate to the second substrate and after attaching the bottom surface of the ring part of the lid.

20. The method of claim 18, further comprising:
attaching sidewalls of the plurality of overhang parts of the lid to the corner sidewalls of the first substrate by the first adhesive.

* * * * *